United States Patent
Van Der Veen

(10) Patent No.: US 7,368,732 B2
(45) Date of Patent: May 6, 2008

(54) LITHOGRAPHIC APPARATUS, DEVICE MANUFACTURING METHOD, DEVICE MANUFACTURED THEREBY, AND COMPUTER PROGRAM

(75) Inventor: Paul Van Der Veen, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 88 days.

(21) Appl. No.: 11/257,081

(22) Filed: Oct. 25, 2005

(65) Prior Publication Data
US 2006/0033051 A1 Feb. 16, 2006

Related U.S. Application Data

(63) Continuation of application No. 10/315,228, filed on Dec. 10, 2002, now Pat. No. 6,989,544.

(30) Foreign Application Priority Data
Dec. 12, 2001 (EP) ................... 01310371

(51) Int. Cl.
*A61N 5/00* (2006.01)
(52) U.S. Cl. ................................. 250/492.2
(58) Field of Classification Search ............. 250/492.2; 355/53, 72, 75; 134/1
See application file for complete search history.

(56) References Cited

U.S. PATENT DOCUMENTS

| 4,460,270 | A | 7/1984 | Watai et al. |
| 4,541,715 | A | 9/1985 | Akiyama et al. |
| 5,171,965 | A | 12/1992 | Suzuki et al. |
| 6,268,904 | B1 | 7/2001 | Mori et al. |
| 6,542,220 | B1 | 4/2003 | Schrijver et al. |
| 6,989,544 | B2 * | 1/2006 | Van Der Veen .......... 250/492.2 |

FOREIGN PATENT DOCUMENTS

| EP | 0 833 193 A2 | 4/1998 |
| EP | 1 209 526 A1 | 5/2002 |
| JP | 60188950 | 9/1985 |
| JP | 11-260288 | 9/1999 |

* cited by examiner

*Primary Examiner*—Kiet T. Nguyen
(74) *Attorney, Agent, or Firm*—Pillsbury Winthrop Shaw Pittman LLP

(57) ABSTRACT

The transmission or reflection loss due to surface contamination of a mask is predicted as a function of position on the mask and time. At the time of an exposure compensation for the transmission or reflection loss is effected using a device capable of adjusting the beam intensity across the length of an exposure field.

25 Claims, 3 Drawing Sheets

LITHOGRAPHIC APPARATUS, DEVICE MANUFACTURING METHOD, DEVICE MANUFACTURED THEREBY, AND COMPUTER PROGRAM

CROSS REFERENCE TO RELATED APPLICATIONS

This application is a continuation of U.S. application Ser. No. 10/315,228, filed Dec. 10, 2002 now U.S. Pat. No. 6,989,544, now allowed, which claimed priority to European Patent Application 01310371.8, filed Dec. 12, 2001, the contents of both of which are incorporated herein by reference in their entirety.

BACKGROUND OF THE INVENTION

1. Field of the Invention

The present invention relates to a lithographic apparatus, a device manufacturing method and device manufactured thereby, and a computer program.

2. Description of the Related Art

The term "patterning device" as here employed should be broadly interpreted as referring to device that can be used to endow an incoming radiation beam with a patterned cross-section, corresponding to a pattern that is to be created in a target portion of the substrate. The term "light valve" can also be used in this context. Generally, the pattern will correspond to a particular functional layer in a device being created in the target portion, such as an integrated circuit or other device (see below). An example of such a patterning device is a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support will generally be a mask table, which ensures that the mask can be held at a desired position in the incoming radiation beam, and that it can be moved relative to the beam if so desired.

Another example of a patterning device is a programmable mirror array. One example of such an array is a matrix-addressable surface having a viscoelastic control layer and a reflective surface. The basic principle behind such an apparatus is that, for example, addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind. In this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localized electric field, or by employing piezoelectric actuators. Once again, the mirrors are matrix-addressable, such that addressed mirrors will reflect an incoming radiation beam in a different direction to unaddressed mirrors. In this manner, the reflected beam is patterned according to the addressing pattern of the matrix-addressable mirrors. The required matrix addressing can be performed using suitable electronics. In both of the situations described hereabove, the patterning device can comprise one or more programmable mirror arrays. More information on mirror arrays as here referred to can be seen, for example, from United States Patents U.S. Pat. Nos. 5,296,891 and 5,523,193, and PCT publications WO 98/38597 and WO 98/33096. In the case of a programmable mirror array, the support may be embodied as a frame or table, for example, which may be fixed or movable as required.

Another example of a patterning device is a programmable LCD array. An example of such a construction is given in U.S. Pat. No. 5,229,872. As above, the support in this case may be embodied as a frame or table, for example, which may be fixed or movable as required.

For purposes of simplicity, the rest of this text may, at certain locations, specifically direct itself to examples involving a mask and mask table. However, the general principles discussed in such instances should be seen in the broader context of the patterning device as hereabove set forth.

Lithographic projection apparatus can be used, for example, in the manufacture of integrated circuits (IC's). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion at once. Such an apparatus is commonly referred to as a wafer stepper. In an alternative apparatus, commonly referred to as a step-and-scan apparatus, each target portion is irradiated by progressively scanning the mask pattern under the beam in a given reference direction (the "scanning" direction) while synchronously scanning the substrate table parallel or antiparallel to this direction. Since, in general, the projection system will have a magnification factor M (generally <1), the speed V at which the substrate table is scanned will be a factor M times that at which the mask table is scanned. More information with regard to lithographic devices as here described can be seen, for example, from U.S. Pat. No. 6,046,792.

In a known manufacturing process using a lithographic projection apparatus, a pattern (e.g. in a mask) is imaged onto a substrate that is at least partially covered by a layer of radiation-sensitive material (resist). Prior to this imaging, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. It is important to ensure that the overlay (juxtaposition) of the various stacked layers is as accurate as possible. For this purpose, a small reference mark is provided at one or more positions on the wafer, thus defining the origin of a coordinate system on the wafer. Using optical and electronic devices in combination with the substrate holder positioning device (referred to hereinafter as "alignment system"), this mark can then be relocated each time a new layer has to be juxtaposed on an existing layer, and can be used as an alignment reference. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens." However, this term should be broadly interpreted as encompassing various types of projection system, including refractive optics, reflective optics, and catadioptric systems, for example. The radiation system may also include components operating according to any of these design types for directing, shaping or controlling the beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel or preparatory steps may be carried out on one or more tables while one or more other tables are being used for exposures. Dual stage lithographic apparatus are-described, for example, in U.S. Pat. Nos. 5,969,441 and 6,262,796.

In order to image smaller features than is possible with systems presently available commercially that use 193 nm exposure radiation, it is proposed to use 157 nm radiation instead. However, 157 nm radiation is strongly absorbed by water and hydrocarbons so that contamination of a lithographic apparatus using 157 nm radiation causes a significant loss of energy from the beam. While a uniform loss of energy from the beam can be compensated for by increasing the output of the radiation source (within limits) or by increasing exposure times (at the cost of throughput), uneven contamination of the mask can lead to unacceptable dose variation across an exposure. Dose errors can lead to variation in the sizes of printed features. It is known to keep masks in clean conditions and to clean them, for example by using UV lamps, prior to use. Nevertheless, sufficient residual contamination can remain to adversely affect exposures, and contamination can build up during use of a mask for a series of exposures.

U.S. Pat. No. 4,451,715 discloses an apparatus for detecting contaminants deposited on a reticle in a lithographic projection apparatus using a laser spot scanner. In the event a contaminant is detected, the reticle is cleaned.

It should be noted that the provision of a pellicle does not alleviate this problem, although contaminants on a pellicle are out of focus and do not print, there is still a localized loss of intensity.

Also, known arrangements, such as disclosed in U.S. Pat. No. 6,115,107, where an energy sensor is calibrated by measurements taken at wafer level, do not take account of mask contamination. The calibration is performed off-line, without a mask in place or with a reference mark, not a production mask, in place.

SUMMARY OF THE INVENTION

It is an aspect of the present invention to avoid or reduce dose variations caused by contamination of the mask by absorbent compounds, dust, or other particulates.

This and other aspects are achieved according to the invention in a lithographic apparatus including a radiation system constructed and arranged to supply a beam of radiation; a support constructed and arranged to support a patterning device, the patterning device constructed and arranged to pattern the beam according to a desired pattern; a substrate table constructed and arranged to hold a substrate; a projection system constructed and arranged to project the patterned beam onto a target portion of the substrate; and a controller that predicts the undesired intensity loss in the patterned beam due to surface contamination of the patterning device and compensates, responsive to the predicted intensity loss, for the predicted intensity loss.

The present invention, by predicting and compensating for intensity losses due to surface contamination of the patterning device can improve delivery of the correct dose at substrate level and improve uniformity. Preferably, the intensity losses are predicted as a function of position surface contamination on the patterning device and time. At the time of an exposure, the instantaneous intensity loss is predicted and the compensation effected accordingly. This can further improve the dose accuracy and uniformity.

The prediction of intensity loss can be based on empirical data, e.g. derived from test exposures, characterizing temporally and spatially the contamination patterns of the apparatus or other apparatus of like type. Where the patterning device is a mask, the empirical data may also characterize the contamination pattern of any associated mask handling devices, such as a mask library, and the operational effectiveness of any associated cleaning devices.

The intensity loss may be due to a decrease in transmissivity in a transmissive mask or a decrease in reflectivity in a reflective mask.

The present invention can also predict and correct irradiation induced transmission/reflection losses in the mask, instead of or in addition to intensity losses due to surface contamination. Such irradiation induced transmission/reflection losses occur because of the physical properties of the material from which the mask is made and may include transient effects and long-term effects, including permanent degradation of the mask, which are predicted on the basis of the history of use of the mask. The irradiation induced transmission/reflection losses can be predicted on the basis of theoretical calculations or empirical data derived by experiment with samples of the material from which the mask is made.

According to a further aspect of the invention there is provided a device manufacturing method, the method including providing a beam of radiation using a radiation system; using a patterning device to endow the beam with a pattern in its cross-section; projecting the patterned beam of radiation onto a target portion of a layer of radiation-sensitive material at least partially covering a substrate; predicting the undesired intensity loss in the patterned beam due to surface contamination of the patterning device; and compensating for the predicted intensity loss.

The present invention further provides a computer program for operating a lithographic projection apparatus, the computer program comprising a code that instructs a computer to predict the undesired intensity loss in the patterned beam due to surface contamination of the patterning device and control the lithographic projection apparatus to compensate for the predicted intensity loss. Such a computer program can be provided as an upgrade to existing lithographic apparatus.

Although specific reference may be made in this text to the use of the apparatus according to the invention in the manufacture of IC's, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. One of ordinary skill in the art will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range 5-20 nm).

BRIEF DESCRIPTION OF THE DRAWINGS

Embodiments of the present invention will now be described, by way of example only, with reference to the accompanying schematic drawings in which.

In the Figures, corresponding reference symbols indicate corresponding parts.

DETAILED DESCRIPTION

Figure 1:
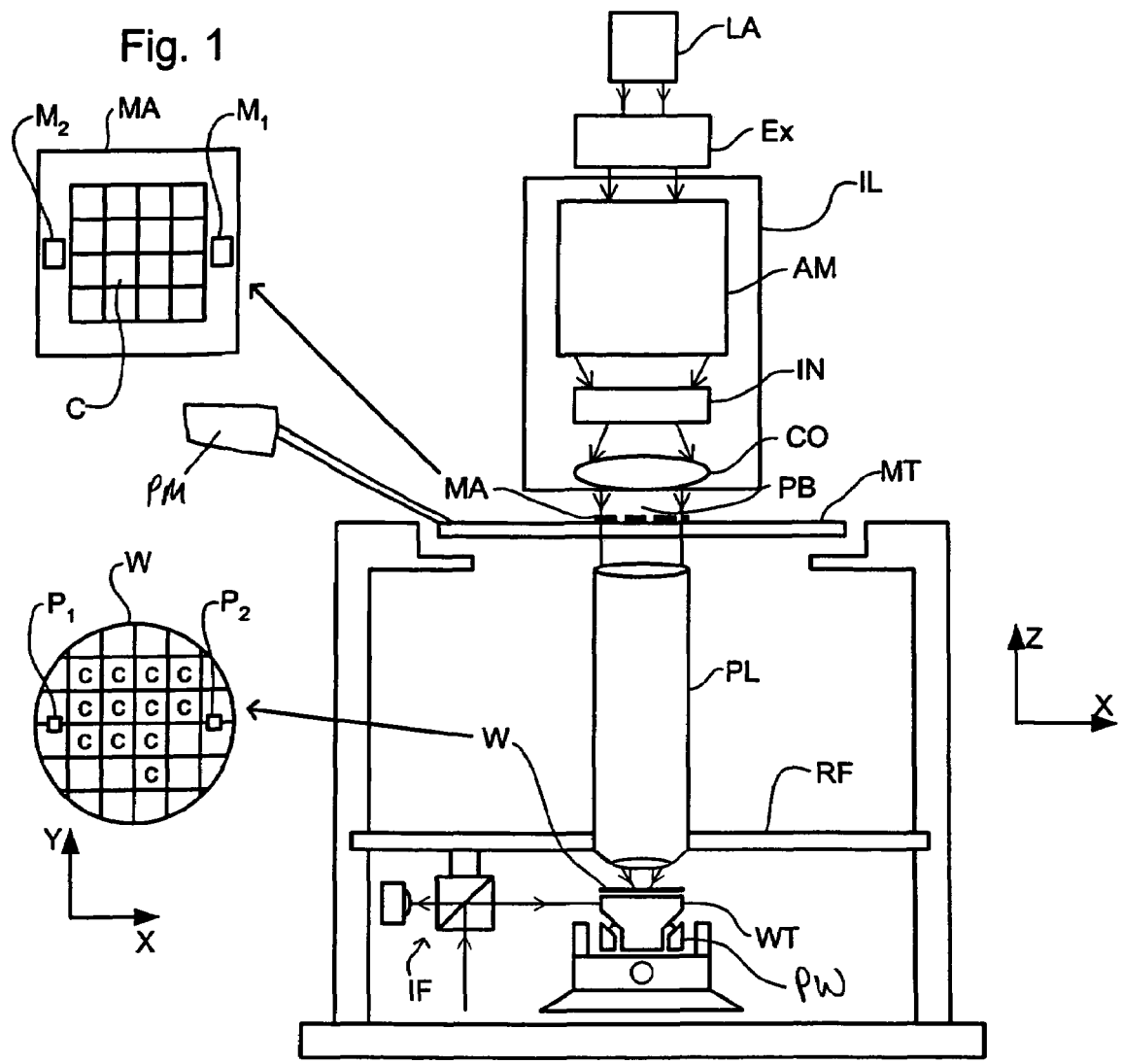
FIG. 1 depicts a lithographic projection apparatus according to an embodiment of the invention.

FIG. 1 schematically depicts a lithographic projection apparatus 1 according to an embodiment of the present invention. The apparatus includes a radiation system Ex, IL that supplies a beam PB of radiation (e.g. UV or EUV radiation, such as, for example, generated by an excimer laser operating at a wavelength of 248 nm, 193 nm or 157 nm, or by a laser-fired plasma source operating at 13.6 nm). In this embodiment, the radiation system also comprises a radiation source LA. The apparatus also includes a first object table (mask table) MT provided with a mask holder for holding a mask MA (e.g. a reticle), and connected to a first positioning device PM to accurately position the mask with respect to a projection system PL; a second object table (substrate table) WT provided with a substrate holder for holding a substrate W (e.g. a resist-coated silicon wafer), and connected to a second positioning device PW to accurately position the substrate with respect to the projection system or lens PL. The projection system or lens PL (e.g. a quartz and/or $CaF_2$ lens system or a refractive or catadioptric system, a mirror group or an array of field deflectors) is constructed and arranged to image an irradiated portion of the mask MA onto a target portion C (e.g. comprising one or more dies) of the substrate W. The projection system PL is supported on a reference frame RF. As here depicted, the apparatus is of a transmissive type (i.e. has a transmissive mask). However, in general, it may also be of a reflective type, for example with a reflective mask. Alternatively, the apparatus may employ another kind of patterning device, such as a programmable mirror array of a type as referred to above.

The source LA (e.g. a UV excimer laser, an undulator or wiggler provided around the path of an electron beam in a storage ring or synchrotron, a laser-produced plasma source, a discharge source or an electron or ion beam source) produces radiation. The radiation is fed into an illumination system (illuminator) IL, either directly or after having traversed a conditioner, such as a beam expander Ex, for example. The illuminator IL may comprise an adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors). The latter scenario is often the case when the source LA is an excimer laser. The present invention encompasses both of these scenarios. In particular, the present invention and claims encompass embodiments wherein the radiation system Ex, IL is adapted to supply a beam of radiation having a wavelength of less than about 170 nm, such as with wavelengths of 157 nm, 126 nm and 13.6 nm, for example.

The beam PB subsequently intercepts the mask MA, which is held on the mask table MT. Having traversed the mask MA, the beam PB passes through the lens PL, which focuses the beam PB onto a target portion C of the substrate W. With the aid of the second positioning device PW (and interferometer IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realized with the aid of a long-stroke module (coarse positioning) and a short-stroke module (fine positioning). However, in the case of a wafer stepper (as opposed to a step and scan apparatus) the mask table MT may just be connected to a short stroke actuator, or may be fixed. The mask MA and the substrate W may be aligned using mask alignment marks $M_1$, $M_2$ and substrate alignment marks $P_1$, $P_2$.

The depicted apparatus can be used in two different modes:

1. In step mode, the mask table MT is kept essentially stationary, and an entire mask image is projected at once, i.e. a single "flash," onto a target portion C. The substrate table WT is then shifted in the X and/or Y directions so that a different target portion C can be irradiated by the beam PB;

2. In scan mode, essentially the same scenario applies, except that a given target portion C is not exposed in a single "flash." Instead, the mask table MT is movable in a given direction (the so-called "scan direction", e.g. the Y direction) with a speed v, so that the beam PB is caused to scan over a mask image. Concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
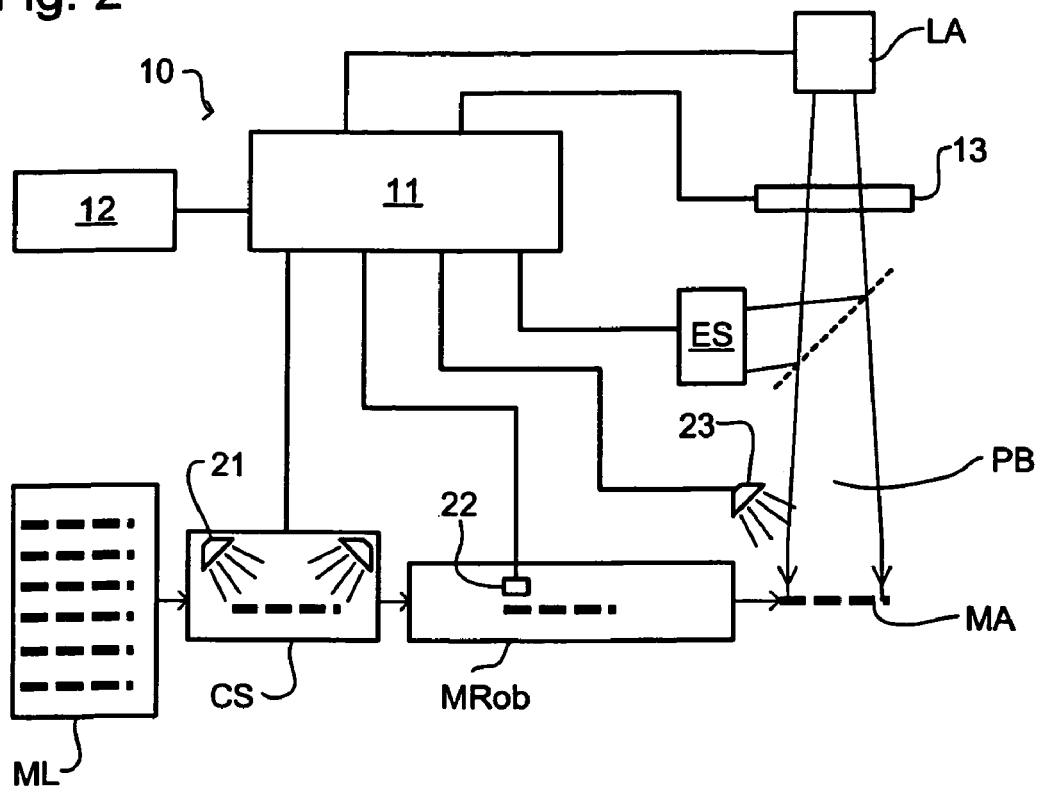
FIG. 2 depicts components of a control system in the embodiment of the invention.

FIG. 2 depicts selected components of the lithographic apparatus of FIG. 1 relating to the loading of masks into the apparatus and the control of the exposure, including the dose delivered to the substrate. Other parts are omitted for clarity.

Masks to be used in a production run are stored in a mask library ML provided adjacent the lithographic apparatus. While the masks are manufactured, transported and stored under clean conditions, nevertheless contaminants that absorb UV radiation, especially radiation at 157 nm, may be present and may cause undesirable decreases in transmission, uniformity and dose control. Such contaminants may include volatile contaminants such as hydrocarbons and water as well as non-volatile contaminants, e.g. deriving from packaging and cleaning materials. Additionally, volatile contaminants may be deposited on the mask from fab air in the lithography unit when the masks are loaded into the lithographic apparatus.

To minimize contamination, masks may pass through a cleaning station CS before being loaded into the lithographic apparatus by a mask robot MRob. At the cleaning station CS, the mask is, for example, irradiated by UV lamps 21 to drive off at least some volatile contaminants.

Even after such cleaning, contaminants will remain on the mask and further contaminants may be deposited on the mask during loading into the lithographic apparatus and while the mask is held in the lithographic apparatus for a series of exposures. According to the present invention, the contamination of the mask is characterized by the resulting mask transmissivity error (MTE) which is a function of space (position on the mask) and time. It will be appreciated by those of ordinary skill that the contamination of a mask in a reflective system is characterized by a resulting mask reflectivity error.

For a given mask, cleaning station and/or lithographic apparatus, the MTE function is determined by a compilation of measurement, e.g. using a sensor 22 in the mask robot MRob, and/or prediction, e.g. based on calibration measurements carried out in advance. The MTE function may also take account of the cleaning effect of the beam radiation during an exposure. This is described further below.

In an embodiment of the present invention, the MTE function for a mask being loaded into the lithographic apparatus is calculated by a controller 11 of a computer 10 on the basis of information as to the cleaning process carried out by cleaning station CS, data from sensor 22 and empirical data stored in a storage device 12 of the computer 10 and relating to the specific set up and characteristics of the lithographic and mask handling arrangements. The empirical data may be derived from experiments carried out on the lithographic apparatus in question or on other lithographic apparatus of the same type or even, to the extent that the relevant effects are comparable, on different types of apparatus.

The history of the stage of the mask, e.g. the length of time the mask has been stored and under what conditions, can also be taken into account. Further, if the mask has a pellicle, the type of glue used to attach the pellicle can be taken into account. If a lamp 23 is provided for in-situ mask cleaning, the operation of this may also be taken into account.

Given the MTE as a function of space and time, the transmission error over the area of the mask at the time of a specific exposure can be calculated and appropriate corrections applied to improve uniformity and deliver the correct dosage to the substrate. The correction may involve control of: the radiation source LA output; the exposure duration (scanning speed in a scanner); and/or local dose adjustments. It will be appreciated that any adjustments necessitated by the MTE will be combined with other control schemes dealing with other effects and with feedback control of the radiation source LA output using energy sensor ES which monitors a fraction of the beam PB directed aside by, for example, a partial mirror.

In an embodiment of the invention, the MTE at the time of an exposure is calculated by the controller 11 and appropriate control signals are provided to radiation source LA and/or, a variable aperture and/or a local dose adjustment device 13. Exposure duration control can also be effected by control signals provided to a shutter (not shown) and to the mask and substrate table positioning systems. Optionally, the predicted MTE may be referred to in determining whether to operate any in-situ cleaning device that may be provided.

The local dose adjustment device may be a device as described in U.S. Pat. No. 6,013,401, if the lithography apparatus is of the scanning type. A device such as described in EP-A 0 952 491 may also be used.

To control the dose, it is convenient to compensate for an overall transmission offset by controlling the source intensity, a variable aperture or the exposure duration. Local differences from the offset are then compensated for by the local dose control device 13.

To calculate the transmission loss caused by a contaminant, the following formula can be used:

$$\frac{I}{I_o} e^{-\phi\sigma} \quad (1)$$

where I=transmitted intensity
$I_o$=incident intensity
$\phi$=number of absorbed molecules in a monolayer (cm$^{-2}$)
$\sigma$=molecular absorption cross-section at 157 nm (10$^{-8}$ cm$^2$).

For small molecules, such as H$_2$O, a typical value for the number of absorbed molecules in a monolayer is 1×10$^{15}$. For larger molecules, the number of absorbed molecules per unit of surface area depends on the orientation of the absorbed molecules with respect to the surface. In Table 1 below an estimate of transmission losses is presented for two common species. Due to the formation of hydrogen bonds both species will form very stable (hard to remove) monolayers on the surface. The number of monolayers present on the surface is typically between 1 to 4.

| Compound | transmission loss per film (%) | | transmission loss of a mask (%) | |
| --- | --- | --- | --- | --- |
| | 1 monolayer | 3 monolayers | 1 monolayer | 3 monolayers |
| Water | 0.25 | 0.7 | 0.5 | 1.4 |
| Acetone | 1.3 | 3.8 | 2.6 | 7.5 |

Figure 3:
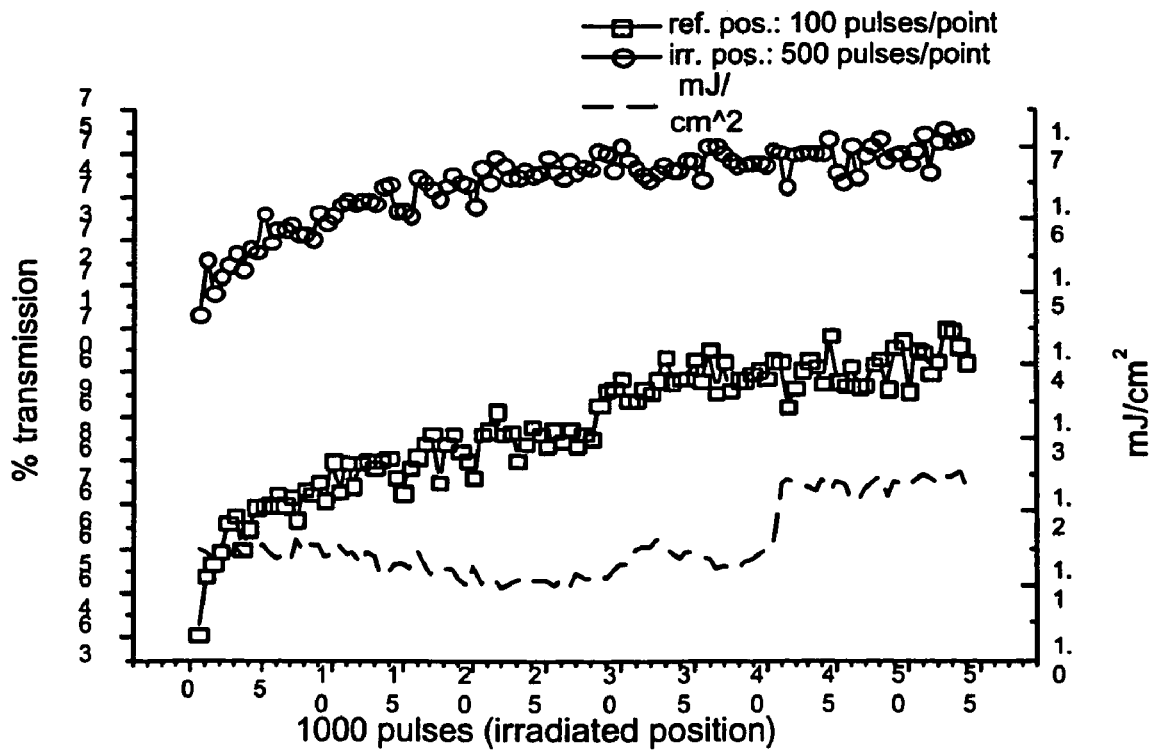
FIGS. 3 and 4 are graphs showing the effect of contamination on the transmission of test reticles.
Figure 4:
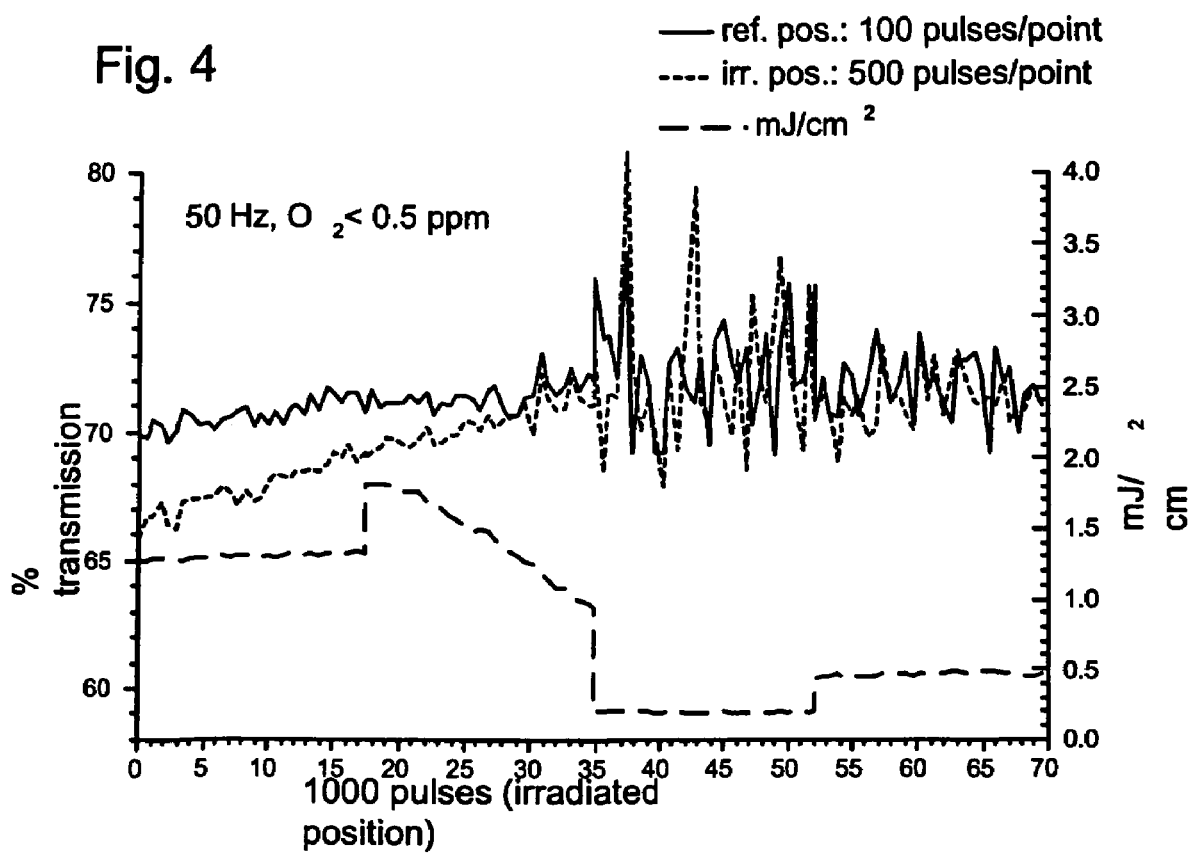

In FIGS. 3 and 4 the results of 157 nm transmission measurements at two points on a quartz reticle substrate are presented. The reticle substrate was a phase 2 quality 157 nm reticle quartz from Asahi. It can be seen from FIGS. 3 and 4 that the transmission of the mask varies with time and position. These variations are compensated for in the present invention.

As shown in FIG. 2 and discussed above, the code is preferably implemented on a programmed general purpose computer 10. However, the code can also be implemented on a special purpose computer, a programmed microprocessor or microcontroller and peripheral integrated circuit elements, an ASIC or other integrated circuit, a digital signal processor, a hardwired electronic or logic circuit such as a discrete element circuit, a programmable logic device such as a PLD, PLA, FPGA or PAL, or the like. In general, any device capable of implementing a finite state machine that is in turn capable of implementing the method described above, can be used to implement the code.

While specific embodiments of the invention have been described above, it will be appreciated that the invention may be practiced otherwise than as described. The description is not intended to limit the invention.

What is claimed is:

1. A lithographic projection apparatus, comprising:
a support constructed and arranged to support a patterning device, the patterning device constructed and arranged to pattern a beam of radiation according to a desired pattern;
a substrate table constructed and arranged to hold a substrate;
a projection system constructed and arranged to project the patterned beam onto a target portion of the substrate; and
a controller configured to predict undesired intensity loss in the patterned beam due to surface contamination of the patterning device and to compensate, responsive to the predicted intensity loss, for the predicted intensity loss.

2. Apparatus according to claim 1, wherein the controller is configured to predict the intensity loss on the basis of a length of a period of time during which the patterning device was not used.

3. Apparatus according to claim 1, wherein the controller is configured to predict the intensity loss on a basis of (i) a length of time, or (ii) a number of exposures performed, or (iii) a total energy irradiated to the patterning device since the patterning device was loaded into the apparatus, or (iv) any combination of (i)-(iii).

4. Apparatus according to claim 1, wherein the patterning device is a mask having a pellicle glued thereto and the controller is configured to predict the intensity loss on a basis of a composition of a glue used to glue the pellicle to the patterning device.

5. Apparatus according to claim 1, wherein the controller is configured to predict the intensity loss at least once per exposure of a target portion and the controller is configured to effects compensation according to each prediction.

6. Apparatus according to claim 1, wherein the controller is configured to adjust an operating parameter of the apparatus.

7. Apparatus according to claim 6, wherein the operating parameter is one of (i) an intensity of the beam supplied by a radiation system, or (ii) a variable attenuator provided in a path of the beam, or (iii) a duration for which the patterned beam is projected onto the target portion, or (iv) any combination of (i)-(iii).

8. Apparatus according to claim 1, wherein the controller is configured to predict the intensity loss as a function of position of surface contamination on the patterning device and to effect a compensation on an exposure dose delivered to the substrate also as a function of position.

9. Apparatus according to claim 1, wherein the prediction is calculated based on empirically derived data relating to the time and spatial distribution of the surface contamination in the apparatus or in a lithographic projection apparatus of a same type.

10. Apparatus according to claim 9, wherein the patterning device is a mask and the empirically derived data includes data relating to contamination in an associated mask handling apparatus and the operation of an associated mask cleaning devices.

11. Apparatus according to claim 1, wherein the controller is configured to predict the undesired intensity loss due to at least one of irradiation induced effects in the patterning device and surface contamination.

12. A device manufacturing method, comprising:
providing a substrate that is at least partially covered by a layer of radiation-sensitive material;
providing a beam of radiation using a radiation system;
using a patterning device to endow the beam with a pattern in its cross-section;
projecting the patterned beam of radiation onto a target portion of the layer of radiation-sensitive material;
predicting undesired intensity loss in the patterned beam due to surface contamination of the patterning device; and
compensating for the predicted intensity loss.

13. The method according to claim 12, comprising predicting the intensity loss on the basis of a length of a period of time during which the patterning device was not used.

14. The method according to claim 12, comprising predicting the intensity loss on a basis of (i) a length of time, or (ii) a number of exposures performed, or (iii) a total energy irradiated to the patterning device since the patterning device was loaded into the apparatus, or (iv) any combination of (i)-(iii).

15. The method according to claim 12, wherein the patterning device is a mask having a pellicle glued thereto and comprising predicting the intensity loss on a basis of a composition of a glue used to glue the pellicle to the mask.

16. The method according to claim 12, comprising predicting the intensity loss at least once per exposure of a target portion and further comprising effecting compensation according to each prediction.

17. The method according to claim 12, further comprising adjusting an operating parameter of a lithographic apparatus used to perform the method.

18. The method according to claim 17, wherein the operating parameter is one of (i) an intensity of the beam supplied by the radiation system, or (ii) a variable attenuator provided in a path of the beam, or (iii) a duration for which the patterned beam is projected onto the target portion, or (iv) any combination of (i)-(iii).

19. The method according to claim 12, comprising predicting the intensity loss as a function of position of surface contamination on the patterning device and further comprising effecting a compensation on an exposure dose delivered to the substrate also as a function of position.

20. The method according to claim 12, wherein the prediction is calculated based on empirically derived data relating to the time and spatial distribution of the surface contamination in a lithographic apparatus used to perform the method or in a lithographic projection apparatus of a same type.

21. The method according to claim 20, wherein the patterning device is a mask and the empirically derived data includes data relating to contamination in an associated mask handling apparatus and the operation of an associated mask cleaning device.

22. The method according to claim 12, comprising predicting the undesired intensity loss due to at least one of irradiation induced effects in the patterning device and surface contamination.

23. A lithographic projection apparatus, comprising:
a support constructed and arranged to support a patterning device, the patterning device constructed and arranged to pattern a beam of radiation according to a desired pattern;
a substrate table constructed and arranged to hold a substrate;
a projection system constructed and arranged to project the patterned beam onto a target portion of the substrate; and
a controller configured to predict undesired intensity loss in the patterned beam due to irradiation induced effects of the patterning device and to compensate, responsive to the predicted intensity loss, for the predicted intensity loss.

24. Apparatus according to claim 23, wherein the controller is configured to predict the intensity loss on a basis of (i) a length of time, or (ii) a number of exposures performed, or (iii) a total energy irradiated to the patterning device since the patterning device was loaded into the apparatus, or (iv) any combination of (i)-(iii).

25. Apparatus according to claim 23, wherein the controller is configured to adjust an operating parameter of the apparatus, the operating parameter being one of (i) an intensity of the beam supplied by a radiation system, or (ii) a variable attenuator provided in a path of the beam, or (iii) a duration for which the patterned beam is projected onto the target portion, or (iv) any combination of (i)-(iii).

* * * * *